United States Patent
Lai et al.

(10) Patent No.: US 8,953,301 B2
(45) Date of Patent: Feb. 10, 2015

(54) CAPACITOR AND MULTILAYER CIRCUIT BOARD USING THE SAME

(71) Applicant: Hon Hai Precision Industry Co., Ltd., New Taipei (TW)

(72) Inventors: Ying-Tso Lai, New Taipei (TW); Hsiao-Yun Su, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/626,896

(22) Filed: Sep. 26, 2012

(65) Prior Publication Data
US 2013/0168145 A1 Jul. 4, 2013

(30) Foreign Application Priority Data
Dec. 28, 2011 (CN) .................................. 100224850

(51) Int. Cl.
*H01G 4/005* (2006.01)

(52) U.S. Cl.
USPC .......................................... 361/303

(58) Field of Classification Search
None
See application file for complete search history.

(56) References Cited

U.S. PATENT DOCUMENTS

| 7,990,676 B2 * | 8/2011 | Topaloglu ..................... 361/303 |
| 8,039,923 B2 * | 10/2011 | Harris et al. .................. 257/532 |
| 2008/0239619 A1 * | 10/2008 | Okamoto et al. ............. 361/303 |

* cited by examiner

*Primary Examiner* — Dion R Ferguson
(74) *Attorney, Agent, or Firm* — Novak Druce Connolly Bove + Quigg LLP

(57) ABSTRACT

A capacitor includes at least two electrode layers opposite to each other and a dielectric layer positioned between the at least two electrode layers. The at least two electrode layers have opposite polarities. Each electrode layer includes a positive electrode and a negative electrode. The positive electrode includes a plurality of first coupling portions spaced substantially evenly and arranged in parallel. The negative electrode includes a plurality of second coupling portions spaced substantially evenly and arranged in parallel. The positive electrode and the negative electrode of each electrode layer are coplanar, and the plurality of first coupling portions interlace with the plurality of second coupling portions.

10 Claims, 5 Drawing Sheets

CAPACITOR AND MULTILAYER CIRCUIT BOARD USING THE SAME

BACKGROUND

1. Technical field

The disclosure generally relates to capacitors and multilayer circuit boards using the capacitors.

2. Description of the Related Art

A capacitor may be located on a circuit board that includes two opposite metal plates and a dielectric layer positioned between the two opposite metal plates. Capacitance of the capacitor is proportional to area of the metal plate, and is inversely proportional to a thickness of the dielectric layer. The area of the metal plate is increased or the thickness of the dielectric layer can be decreased to increase the capacitance of the capacitor. However, an increase in the area of the metal plate wastes space, and a decrease of the thickness of the dielectric layer affects the impedance match of the circuit.

Therefore, there is room for improvement within the art.

BRIEF DESCRIPTION OF THE DRAWINGS

Many aspects of an exemplary capacitor and multilayer circuit board can be better understood with reference to the following drawings. The components in the drawings are not necessarily drawn to scale, the emphasis instead being placed upon clearly illustrating the principles of the exemplary capacitor and multilayer circuit board. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
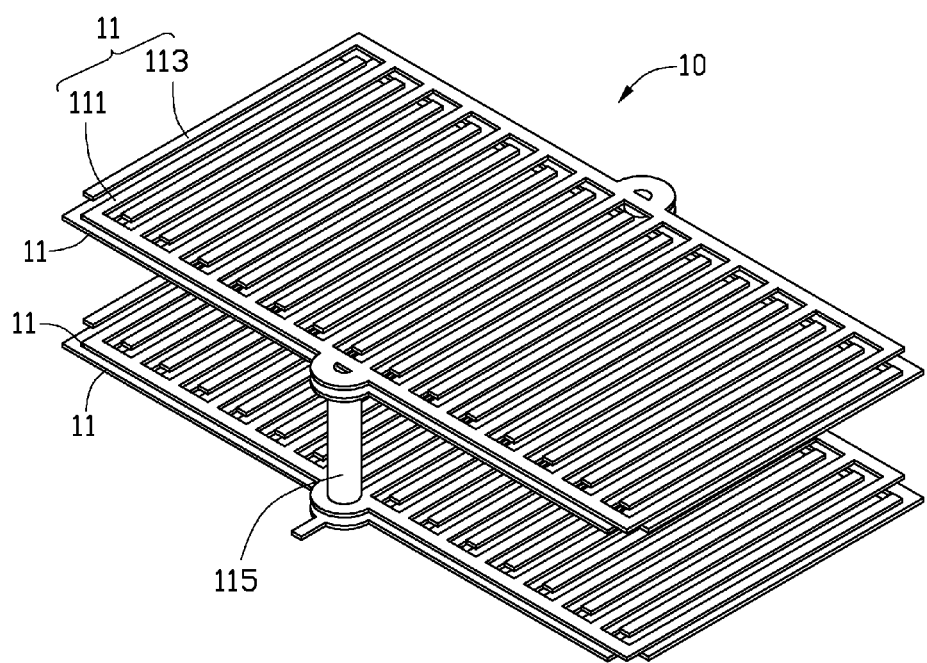
FIG. 1 is a schematic view of a capacitor according to an exemplary embodiment.
Figure 2:
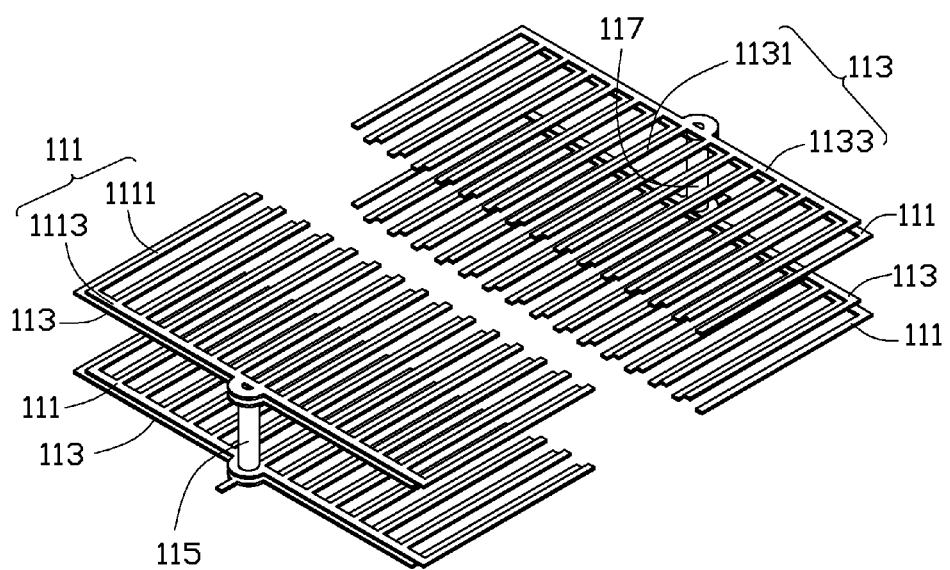
FIG. 2 is an exploded view of the capacitor shown in FIG. 1.

Referring to FIG. 1 and FIG. 2, a capacitor 10 according to an exemplary embodiment is shown. The capacitor 10 includes at least two electrode layers 11 positioned opposite to each other and a dielectric layer (not shown) positioned between the two electrode layers 11. In this exemplary embodiment, the capacitor 10 includes four electrode layers 11, with a dielectric layer positioned between each two electrode layers 11. The electrode layer 11 includes a positive electrode 111 and a negative electrode 113.

The positive electrode 111 includes a plurality of first coupling portions 1111 spaced substantially evenly and arranged in parallel. A first connection portion 1113 perpendicularly connects to the plurality of first coupling portions 1111. The negative electrode 113 includes a plurality of second coupling portions 1131 spaced substantially evenly and arranged in parallel. A second connection portion 1133 perpendicularly connects to the plurality of second coupling portions 1131. In this exemplary embodiment, the plurality of first coupling portions 1111 and the plurality of second coupling portions 1131 are approximately strip shaped. The positive electrode 111 and the negative electrode 113 of each electrode layer 11 are coplanar; the first connection portion 1113 is parallel to the second connection portion 1133, and the plurality of first coupling portions 1111 interlace with the plurality of second coupling portions 1131.

The positive electrodes 111 are electrically connected to a first connector 115 through the first connection portion 1113. The negative electrodes 113 are electrically connected to a second connector 117 through the second connection portion 1133. Each two adjacent electrode layers 11 have opposite polarity, and each positive electrode 111 of one electrode layer 11 is opposite to a negative electrode 113 of the other adjacent electrode layer 11. The positive electrode 111 is coupled to the negative electrode 113 of the same electrode layer 11 and is further coupled to the negative electrode 113 of the adjacent electrode layer 11. The negative electrode 113 is coupled to the positive electrode 111 of the same electrode layer 11 and is further coupled to the positive electrode 111 of the adjacent electrode layer 11.

Figure 3:
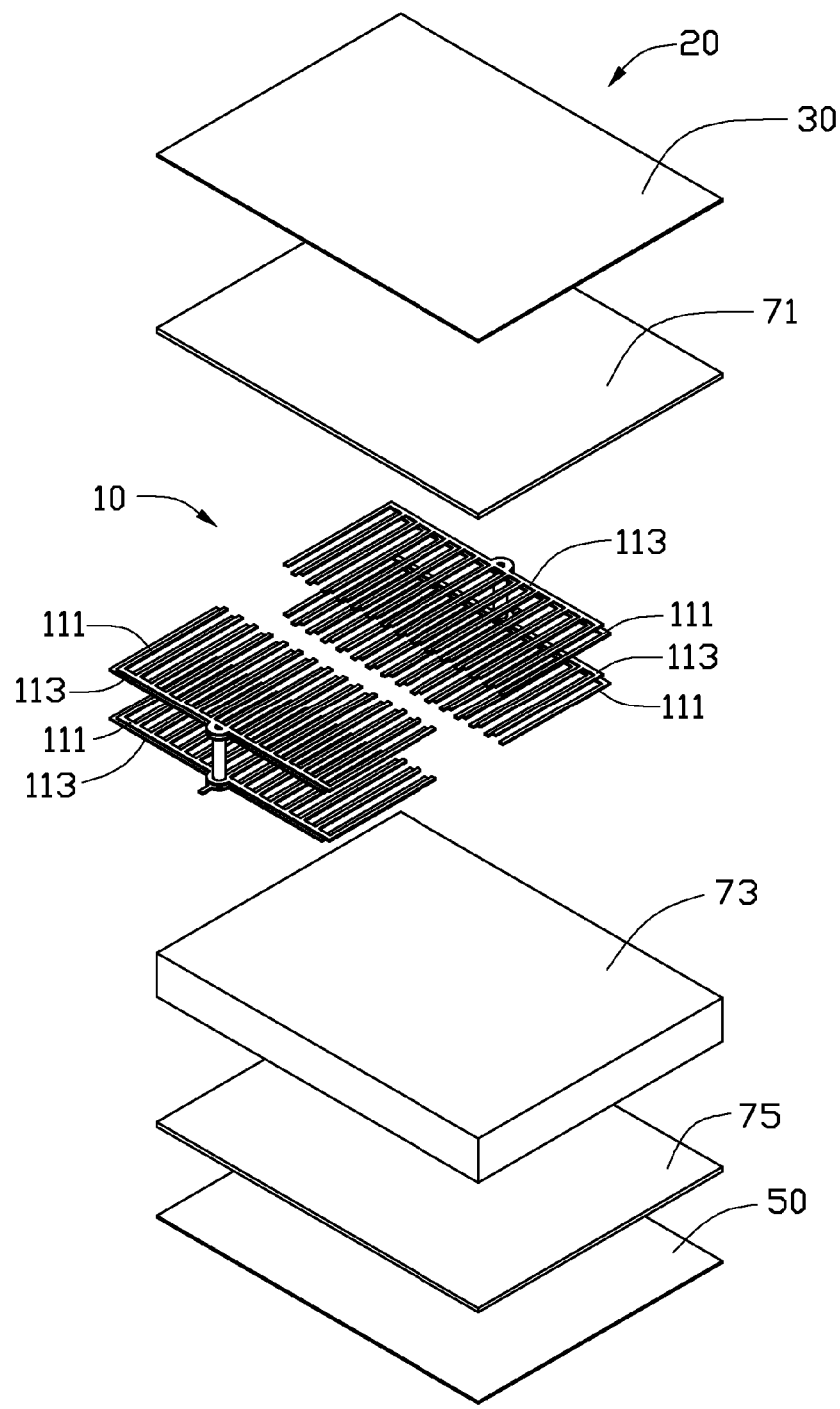
FIG. 3 is a schematic view of a multilayer circuit board according to an exemplary embodiment.
Figure 4:
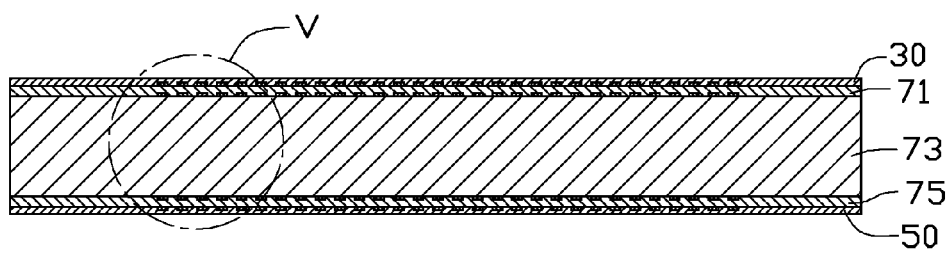
FIG. 4 is a cross-sectional view of the multilayer circuit board shown in FIG. 3.
Figure 5:
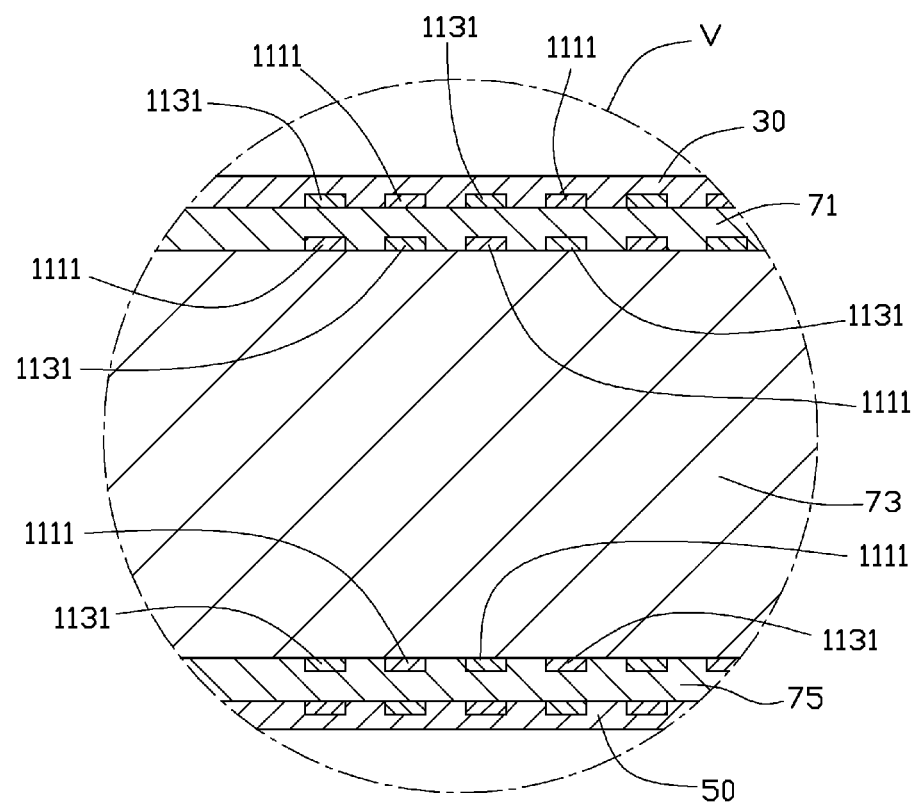
FIG. 5 is an enlarged view of part V shown in FIG. 4.

Referring to FIG. 3, FIG. 4 and FIG. 5, a multilayer circuit board 20 includes a top layer 30, a first middle layer 71, a second middle layer 73, a third middle layer 75, and a bottom layer 50 stacked from top to bottom in order. The top layer 30, the first middle layer 71, the second middle layer 73, the third middle layer 75, and the bottom layer 50 are dielectric, and electrical wiring can be located on or in the dielectric layers.

The capacitor 10 is located in the multilayer circuit board 20. The first middle layer 71 and the third middle layer 75 are respectively located between each two adjacent electrode layers 11 and act as the dielectric layer. The first connector 115 and the second connector 117 are located in the second middle layer 73. The top layer 30 and the bottom layer 50 cover the capacitor 10 together.

Each electrode layer includes a plurality of first coupling portions interlaced with a plurality of second coupling portions. There is not only coupling between two adjacent electrode layers, but also coupling between the first coupling portions and the second coupling portions of the same electrode layer. Therefore, capacitance of the capacitor is increased without changing the size of the capacitor. Furthermore, the capacitor is located within the multilayer circuit board, hence wiring space of the multilayer circuit board is saved.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A capacitor, comprising: at least two electrode layers positioned opposite to each other and having opposite polarities; and a dielectric layer positioned between the at least two electrode layers; wherein each electrode layer comprises a positive electrode and a negative electrode, the positive electrode comprises a first connection portion and a plurality of first coupling portions connected to the first connection portion, the plurality of first coupling portions spaced substantially evenly, aligned and arranged in parallel; the negative electrode comprises a second connection portion and a plurality of second coupling portions connected to the second connection portion, the plurality of second coupling portions spaced substantially evenly, aligned and arranged in parallel; the positive electrode and the negative electrode of each electrode layer are coplanar; and the plurality of first coupling portions interlace with the plurality of second coupling portions; and wherein the capacitor further comprises a first connector and a second connector, the positive electrodes of the at least two electrode layers are electrically connected to the first connector through the first connection portions of the at least two electrode layers, and the negative electrodes of the at least two electrode layers are electrically connected to the second connector through the second connection portions of the at least two electrode layers.

2. The capacitor as claimed in claim 1, wherein the first connection portion is parallel to the second connection portion, and is perpendicular to the plurality of first coupling portions; the second connection portion is perpendicular to the plurality of second coupling portions.

3. The capacitor as claimed in claim 1, wherein the plurality of first coupling portions and the plurality of second coupling portions are approximately strip shaped.

4. A multilayer circuit board, comprising: a top layer; a plurality of middle layers; a bottom layer; and a capacitor positioned between the top layer and the bottom layer and comprising at least two electrode layers opposite to each other and having opposite polarities; wherein one middle layer is positioned between each two electrode layers; each electrode layer comprises a positive electrode and a negative electrode, the positive electrode comprises a first connection portion and a plurality of first coupling portions connected to the first connection portion, the plurality of first coupling portions spaced substantially evenly, aligned and arranged in parallel; the negative electrode comprises a second connection portion and a plurality of second coupling portions connected to the second connection portion, the plurality of second coupling portions spaced substantially evenly, aligned and arranged in parallel; the positive electrode and the negative electrode of each electrode layer are coplanar; and the plurality of first coupling portions interlace with the plurality of second coupling portions; and wherein the capacitor further comprises a first connector and a second connector located in the middle layer, the positive electrodes of the at least two electrode layers are electrically connected to the first connector through the first connection portions of the at least two electrode layers, and the negative electrodes of the at least two electrode layers are electrically connected to the second connector through the second connection portions of the at least two electrode layers.

5. The multilayer circuit board as claimed in claim 4, wherein the first connection portion is parallel to the second connection portion, and is perpendicular to the plurality of first coupling portions; the second connection portion is perpendicular to the plurality of second coupling portions.

6. The multilayer circuit board as claimed in claim 4, wherein the plurality of first coupling portions and the plurality of second coupling portions are approximately strip shaped.

7. The capacitor as claimed in claim 1, wherein the positive electrode is coupled to the negative electrode of the same electrode layer and is further coupled to the negative electrode of the adjacent electrode layer.

8. The capacitor as claimed in claim 1, wherein the negative electrode is coupled to the positive electrode of the same electrode layer and is further coupled to the positive electrode of the adjacent electrode layer.

9. The multilayer circuit board as claimed in claim 4, wherein the positive electrode is coupled to the negative electrode of the same electrode layer and is further coupled to the negative electrode of the adjacent electrode layer.

10. The multilayer circuit board as claimed in claim 4, wherein the negative electrode is coupled to the positive electrode of the same electrode layer and is further coupled to the positive electrode of the adjacent electrode layer.

* * * * *